US008899791B2

(12) United States Patent
Liu

(10) Patent No.: US 8,899,791 B2
(45) Date of Patent: Dec. 2, 2014

(54) FREELY-FOLDABLE FLEXIBLE LED SCREEN

(71) Applicant: Yanping Liu, Shenzhen (CN)

(72) Inventor: Yanping Liu, Shenzhen (CN)

( * ) Notice: Subject to any disclaimer, the term of this patent is extended or adjusted under 35 U.S.C. 154(b) by 177 days.

(21) Appl. No.: 13/747,332

(22) Filed: Jan. 22, 2013

(65) Prior Publication Data

US 2014/0192530 A1 Jul. 10, 2014

(30) Foreign Application Priority Data

Jan. 9, 2013 (CN) .......................... 2013 1 0007332

(51) Int. Cl.
*F21S 4/00* (2006.01)
*F21V 17/00* (2006.01)
*H05K 5/02* (2006.01)

(52) U.S. Cl.
CPC ................ *F21V 17/007* (2013.01); *H05K 5/02* (2013.01)
USPC ................................. 362/249.09; 362/249.04

(58) Field of Classification Search
CPC .......................... F21Y 2101/02; G02B 6/0068
USPC ........................... 362/249.01–249.04, 249.09
See application file for complete search history.

(56) References Cited

U.S. PATENT DOCUMENTS 7,121,687 B2 * 10/2006 Sidwell et al. ........... 362/249.06
7,517,101 B2 * 4/2009 Tobin ................................ 362/1
7,726,839 B2 * 6/2010 Chien ...................... 362/249.03
8,662,705 B2 * 3/2014 Roberts .................... 362/249.04

* cited by examiner

*Primary Examiner* — Vip Patel
(74) *Attorney, Agent, or Firm* — Tim Tingkang Xia, Esq.; Morris, Manning & Martin, LLP

(57) ABSTRACT

A freely-foldable flexible LED screen includes multiple LED sub-screens, PCBs disposed inside casings of the LED sub-screens, LEDs disposed on the PCB, and conducting wires electrically connecting the PCBs. Adjacent LED sub-screens are connected using a connection mechanism capable of freely rotating, which includes a rotation rod, and rotation shafts disposed at two ends of the rotation rod; the casing of the LED sub-screen includes a front casing and a rear casing; where grooves are symmetrically disposed at edges of the front and rear casings, the rotation shafts at two ends of the rotation rod are respectively installed in grooves in the casings of two adjacent LED sub-screens, the grooves of the front and rear casings are further provided with close covers connecting the rotation shafts, where the close cover corresponding to the rotation shaft is provided with a rotation shaft groove that is rotatably connected to the rotation shaft.

10 Claims, 20 Drawing Sheets

FREELY-FOLDABLE FLEXIBLE LED SCREEN

CROSS-REFERENCE TO RELATED APPLICATIONS

This non-provisional application claims priority under 35 U.S.C. §119(a) on Patent Application No. 201310007332.8 filed in P.R. China on Jan. 9, 2013, the entire contents of which are hereby incorporated by reference.

FIELD OF THE INVENTION

The present invention relates to an LED screen for video display, and in particular, to a flexible LED screen that can be freely rotated and folded.

BACKGROUND OF THE INVENTION

An LED screen is a display for displaying texts, graphs, images, cartoons, market information, video, and recorded signals depending on ON and OFF of the LED. With the maturity and popularity of the LED technology, the LED screen is more and more widely used. However, the conventional LED screen cannot be freely folded, and especially cannot be folded at a large angle. This brings inconvenience to transportation, storage, installation, and unloading. Especially for a large-scale LED screen, transportation, storage, installation, and unloading are extremely difficult.

SUMMARY OF THE INVENTION

To solve the technical problem that the conventional LED screens are inconvenient in folding and unfolding, installation, transportation, and storage, the present invention provides a foldable flexible LED screen.

The present invention provides a freely-foldable flexible LED screen, including a plurality of LED sub-screens, PCBs disposed inside casings of the LED sub-screens, LEDs disposed on the PCB, and conducting wires electrically connecting the PCBs. Adjacent LED sub-screens are connected by using a connection mechanism capable of relatively freely rotating.

Preferably, the connection mechanism includes a rotation rod, and rotation shafts disposed at two ends of the rotation rod; the casing of the LED sub-screen includes a front casing and a rear casing; where grooves are symmetrically disposed at edges of the front casing and the rear casing, the rotation shafts at the two ends of the rotation rod are respectively installed in grooves in the casings of two adjacent LED sub-screens, the grooves of the front casing and the rear casing are further provided with close covers connecting to the rotation shafts, where the close cover corresponding to the rotation shaft is provided with a rotation shaft groove that is rotatably connected to the rotation shaft, the rotation shaft being in shape of a cylindrical opening or an elliptical cylinder opening.

Preferably, the rotation rod is formed by connecting at least two rod bodies using a hinge.

Preferably, the connection mechanism includes spindles disposed at the edges of the casings, and a connection rod rotatably connected to the spindles of the casings of two adjacent LED sub-screens, where openings connected to the spindles on the connection rod are circular openings or elliptical openings.

Preferably, the connection rod is formed by connecting at least two rod bodies using a hinge.

Preferably, the connection rod is constituted by two half connection blocks symmetrical to the axial line of the connection rod through a screw.

Preferably, the connection mechanism includes a section of flexible rope, where two ends of the flexible rope are provided with connectors, the two connectors being respectively clipped in clip grooves of the casings of the adjacent LED sub-screens.

Preferably, the connection mechanism includes an entire piece of flexible rope, and connectors spacedly disposed on the entire piece of flexible rope, where the connectors are respectively clipped in clip grooves of the corresponding casings of the LED sub-screens.

Preferably, end faces of the casings of the two adjacent LED sub-screens are provided with positioning mechanisms in a concave and convex spherical shape, where the positioning mechanisms are a spherical groove disposed on the end face of one casing and a spherical boss matching the spherical groove and disposed on the end face of the other casing.

Preferably, the casing of the LED sub-screen includes a front casing and a rear casing, where wire ducts are symmetrically disposed on edges of the rear casing and an isolation boss is further disposed on the middle part of the rear casing According to the present invention, the LED sub-screens 1 are spliced longitudinally and laterally into a large screen. The large screen can be longitudinally or laterally folded. The folded screen has a small size, a smaller weight compared against a traditional casing-type screen, and a smaller transportation and storage cost. Since the LED sub-screens can be freely rotated and folded, a user may easily implement different shapes of screens, for example, arc screen, spherical screen, and cylindrical screen, and moreover, usage and installation are simple and convenient.

BRIEF DESCRIPTION OF THE DRAWINGS

The following describes the present invention in detail with reference to the embodiments and accompanying drawings, where.

DETAILED DESCRIPTION OF THE EMBODIMENTS

Figure 1:
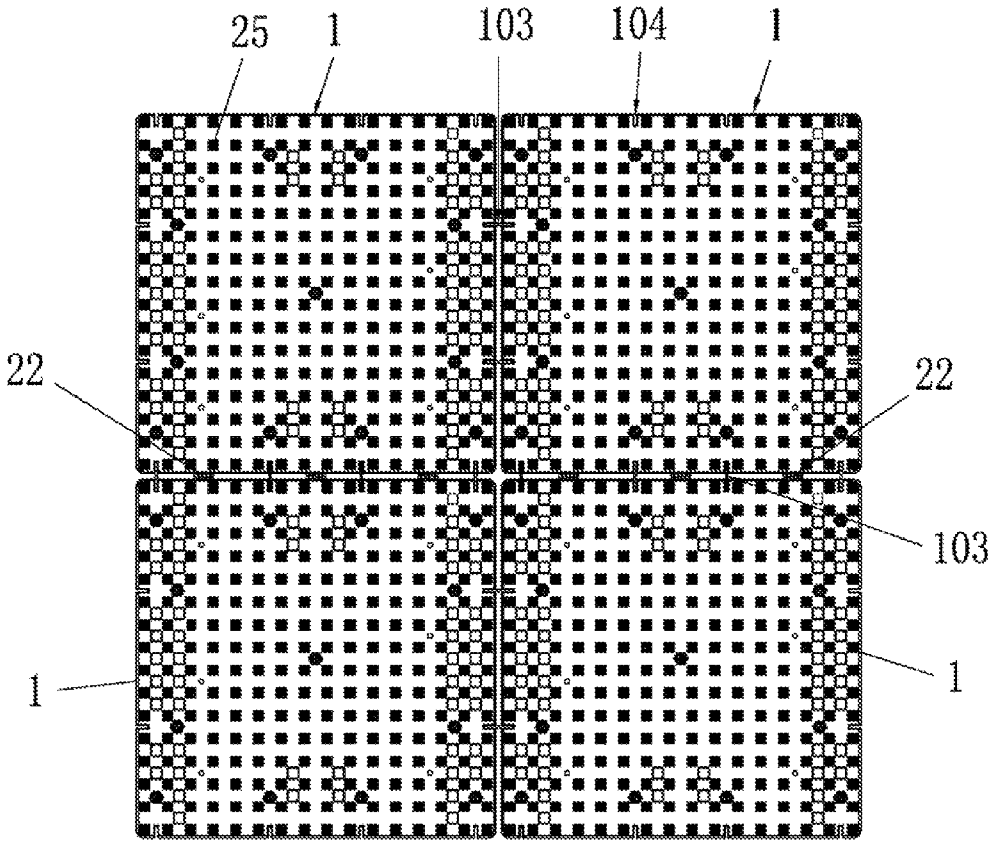
FIG. 1 is a schematic diagram of a freely-foldable flexible LED screen according to the present invention.

As shown in FIG. 1, the present invention provides a freely-foldable flexible LED screen, which is spliced by a plurality of LED sub-screens 1. PCBs are disposed inside the casings of the LED sub-screens 1, LEDs 25 are disposed on the PCBs, and conducting wires 22 electrically connecting the PCBs are disposed inside the casings. Four LED sub-screens 1 that are upper-lower adjacent and left-right adjacent are connected by using a connection mechanism 103 capable of relatively freely rotating. The LED sub-screens 1 are pre-manufactured small pieces of LED screens. As basic unit plate, the dimension of an LED sub-screen typically ranges from 200 mm×200 mm to 80 mm×80 mm. The LED sub-screen may be a square or a rectangular. The number of connection mechanisms 103 to be disposed on one side of an LED sub-screen may be determined by the size of the LED sub-screen and the pitch between the pixels. To achieve special translucent display effect of the LED screen, reduce the weight of the screen, and enhance ventilation to reduce wind resistance, the PCB may be provided with a plurality of holes. The conducting wires 22 serves to transmitting electrical signals and supply power. The conducting wires may be connected to the PCBs in one direction, for example, in a lateral direction or a longitudinal direction, or be connected to the PCBs in two directions, that is, the PCBs are connected using the conducting wires 22 both laterally and longitudinally.

Figure 1A:
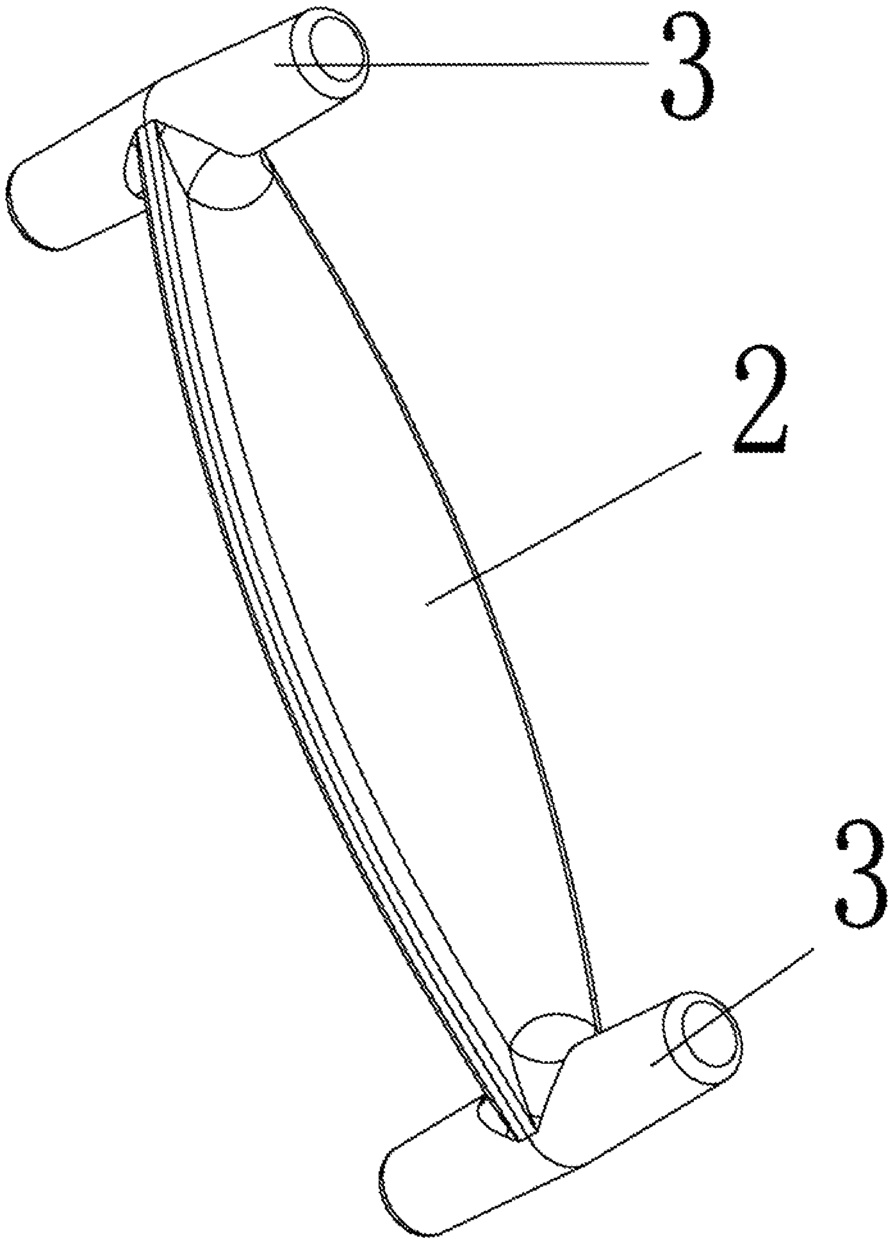
FIG. 1*a* is a three-dimensional view of a rotation rod according to a first embodiment of the present invention.
Figure 1B:
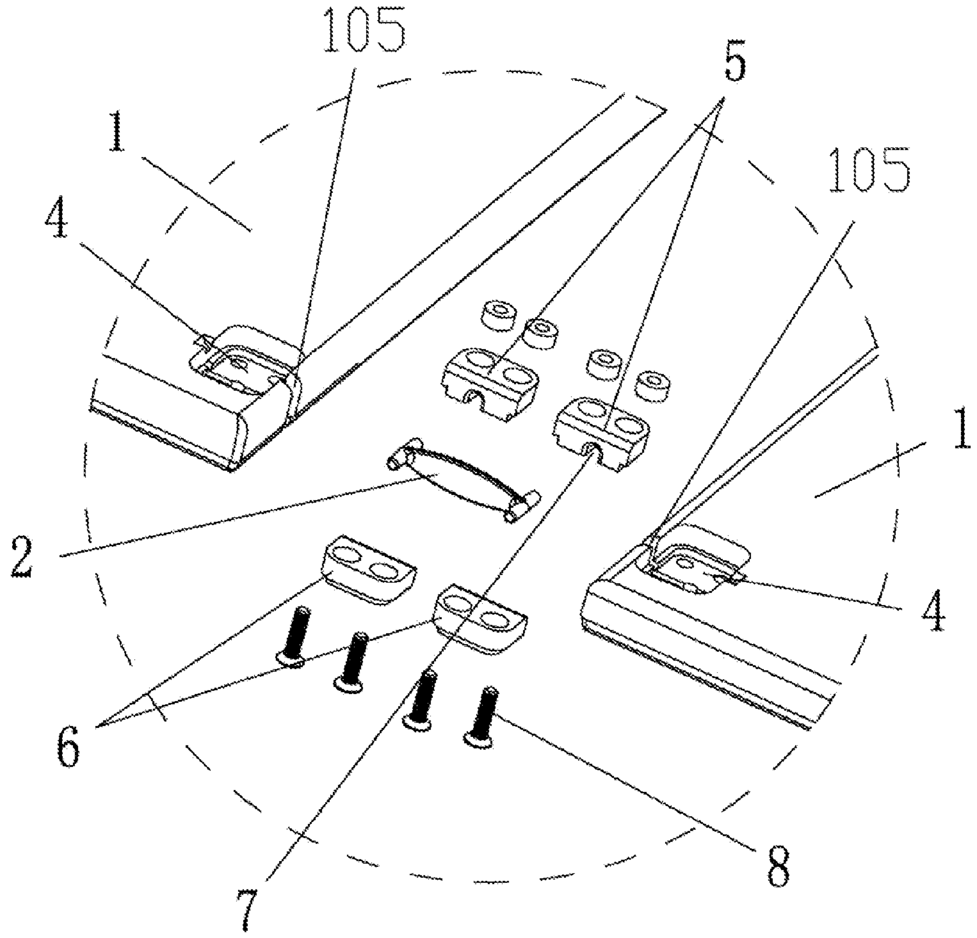
FIG. 1*b* is a schematic exploded diagram of a connection mechanism according to the first embodiment of the present invention.
Figure 1C:
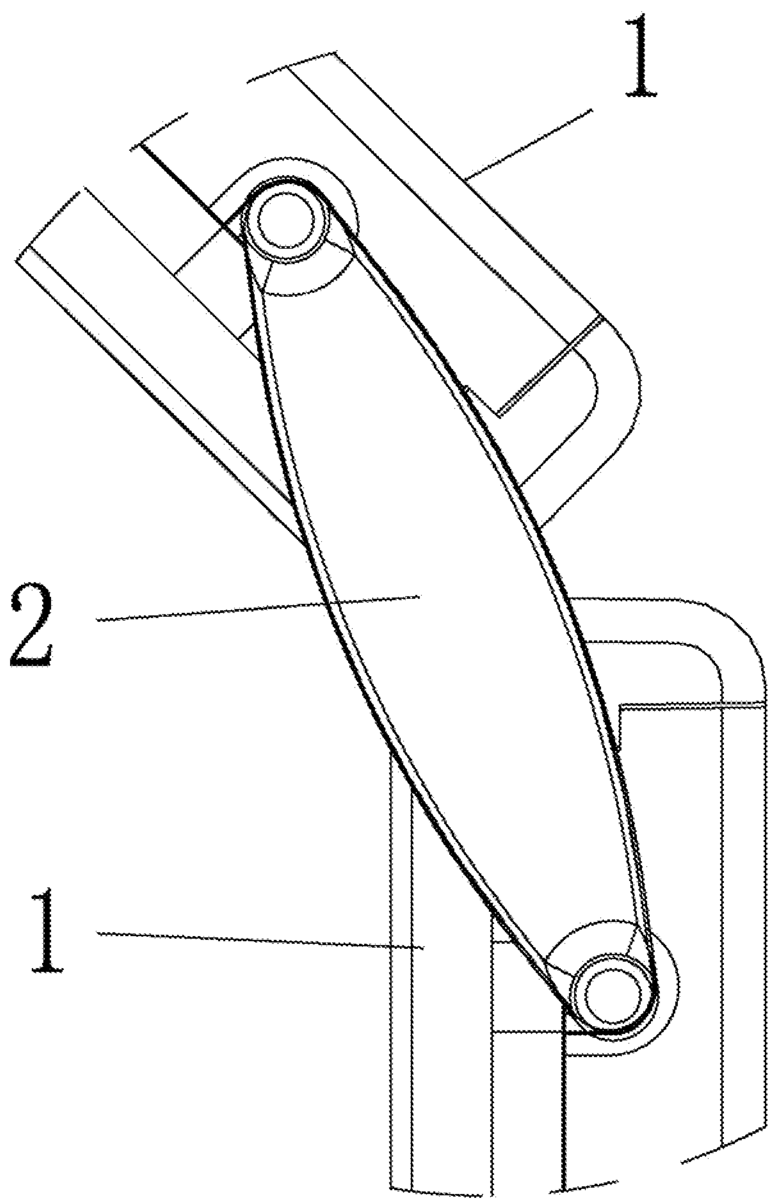
FIG. 1*c* is a schematic connection diagram according to the first embodiment of the present invention.

Referring to FIG. 1*a* to FIG. 1*c*, in a first embodiment of the present invention, the connection mechanism 103 includes: a rotation rod 2, and rotation shafts 3 disposed at two ends of the rotation rod. The casing of the LED sub-screen 1 includes a front casing and a rear casing, where grooves 4 are symmetrically disposed at edges of the front casing and the rear casing, the rotation shafts 3 at the two ends of the rotation rod are respectively installed in grooves in the casings of two adjacent LED sub-screens, the grooves of the front casing and the rear casing are further provided with close covers 5 and 6, where the close cover 5 corresponding to the rotation shaft 3 is provided with a rotation shaft groove 7 that is rotatably connected to the rotation shaft, the rotation shaft groove being in shape of a cylindrical opening or an elliptical cylinder opening (referring to FIG. 3*b*). The close covers 5 and 6 are connected to the front and rear casings by using screws 8, and the grooves 4 of the casings, the rotation shaft groove 7 of the close cover 5, and the rotation shafts 3 of the rotation rod enable adjacent LED sub-screens 1 to be connected in a free rotation manner.

Because the rotation shafts 3 are disposed at the two ends of the rotation rod 2, when adjacent LED sub-screens 1 are rotatably folded centering the rotation shafts 3, 306-degree rotation can be distributed to the two rotation shafts, that is, each LED sub-screen 1 needs to rotate only 180 degrees. This reduces space required for rotation, implements folding and connection of thick screens, and ensures that pitches between pixels on the unfolded screen are consistent. In addition, rotation grooves 105 required for rotation of the rotation rod 2 are further disposed on the casings and PCBs. The rotation grooves are disposed in the gaps between the LEDs, thereby not affecting the display effect of the LED.

Figure 2A:
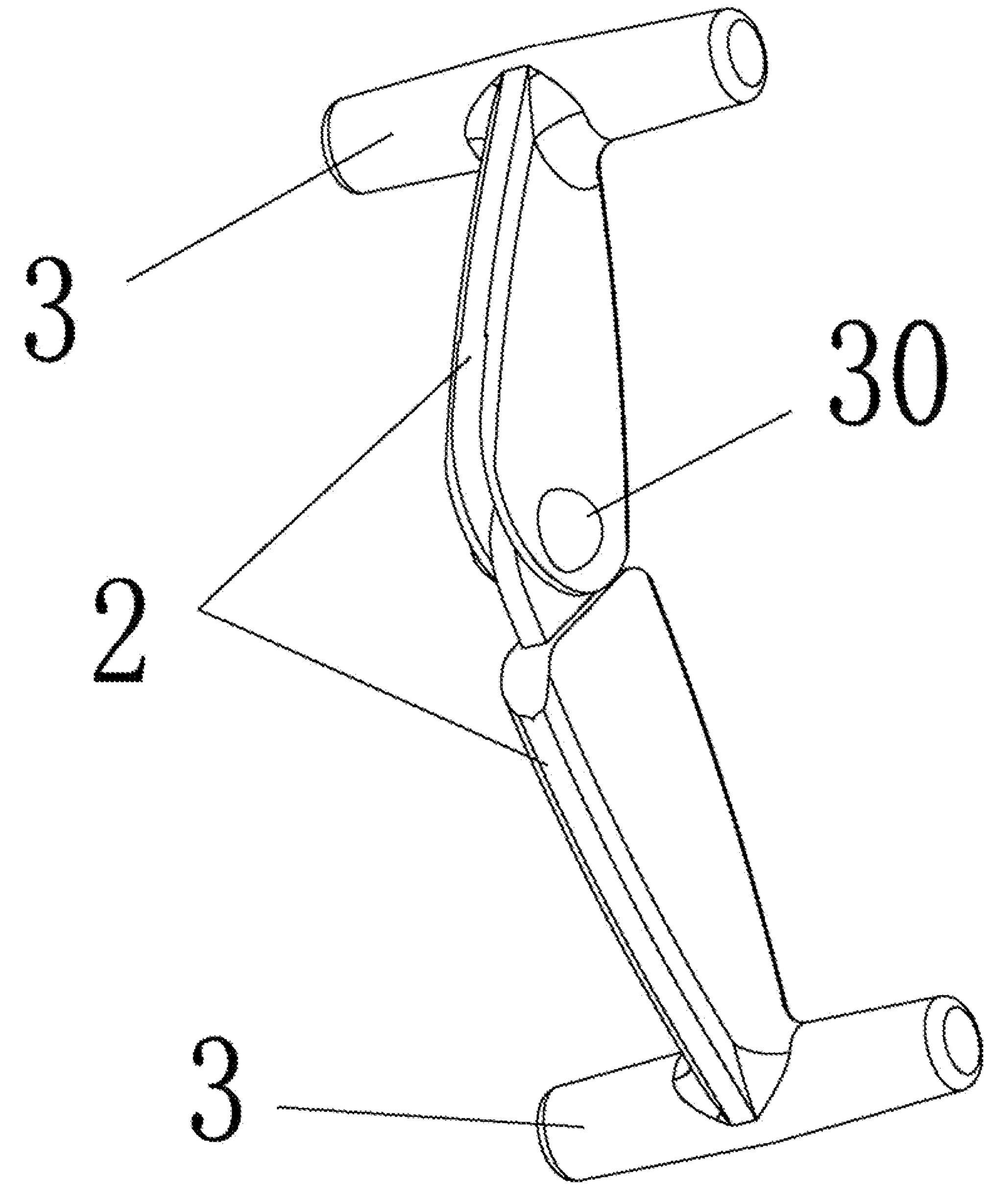
FIG. 2*a* is a three-dimensional view of a rotation rod according to a second embodiment of the present invention.
Figure 2B:
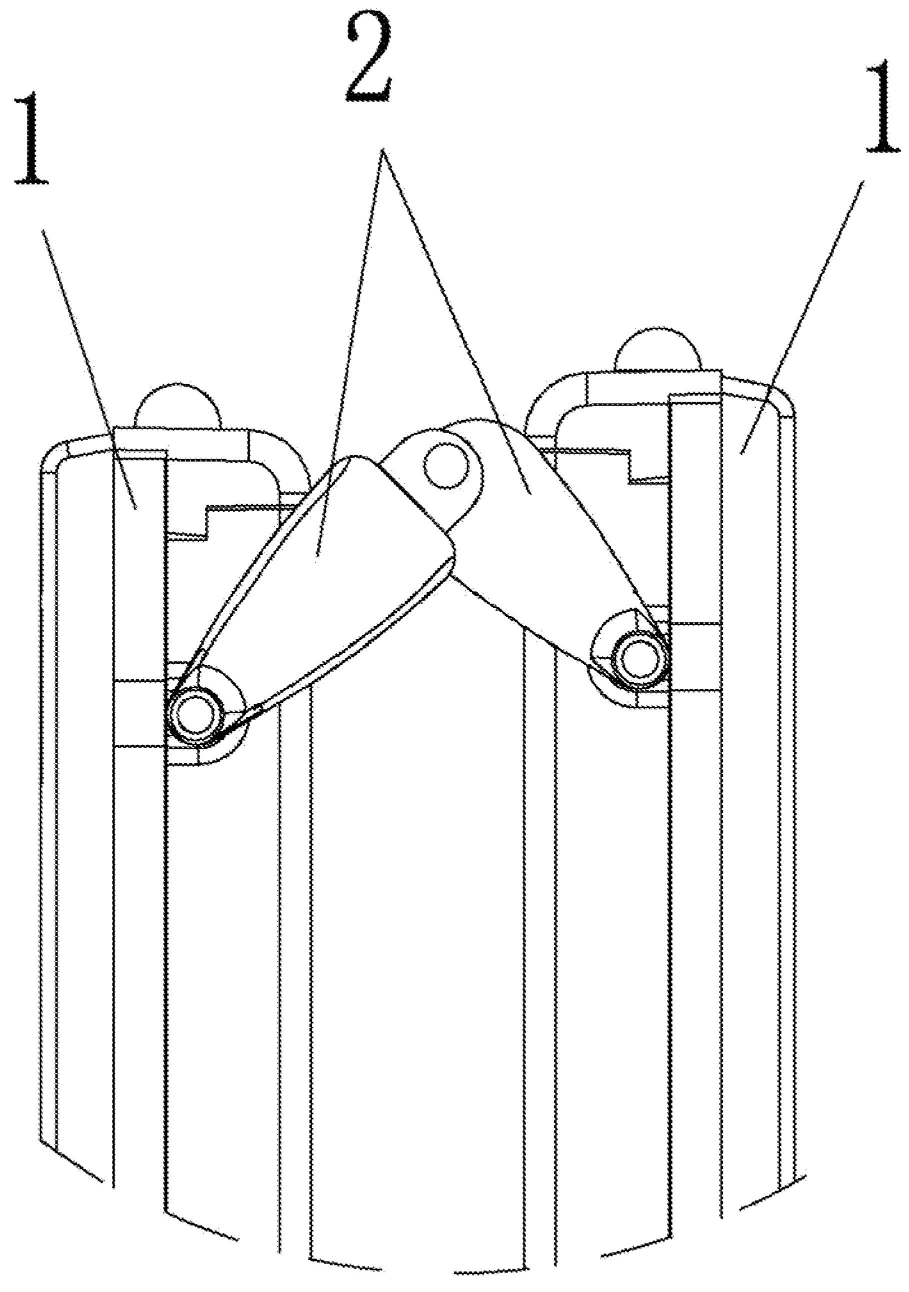
FIG. 2*b* is a schematic structural diagram of superposing one LED sub-screen over another by folding the LED sub-screen according to the second embodiment of the present invention.

Referring to FIG. 2*a* and FIG. 2*b*, in a second embodiment of the present invention, the connection mechanism is basically the same as the connection mechanism disclosed in the first embodiment. The difference lies in that the rotation rod 2 is formed by connecting two rod bodies using a hinge 30. As actually required, the rotation rod may also be formed by connecting more than two rod bodies using hinges. In this structure, three rotation shafts are designed for folding the thicker and larger screens.

Figure 3A:
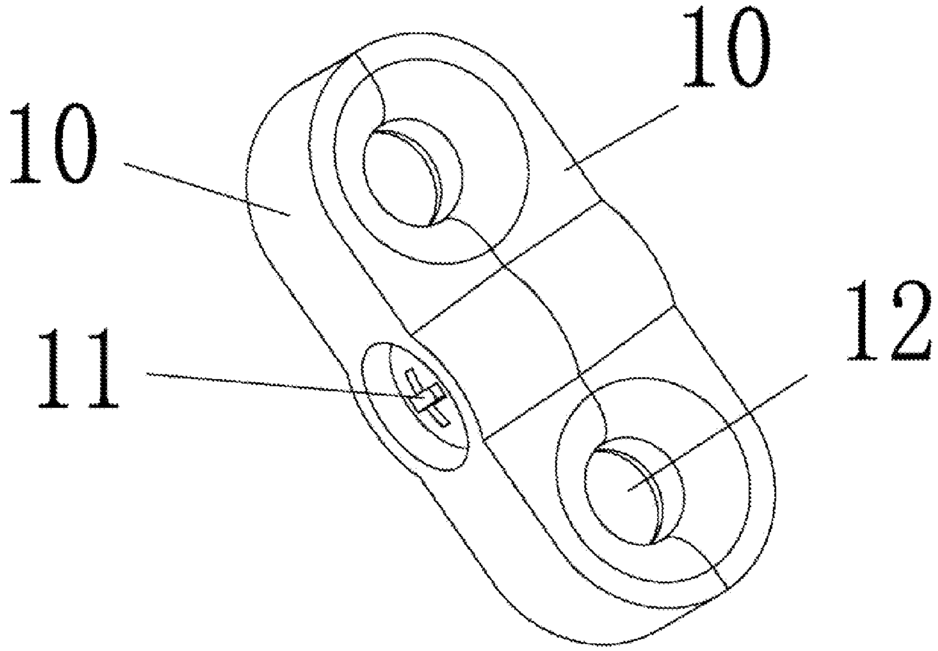
FIGS. 3*a* and 3*b* are three-dimensional structural views of two types of connection rods according to a third embodiment of the present invention.
Figure 3B:
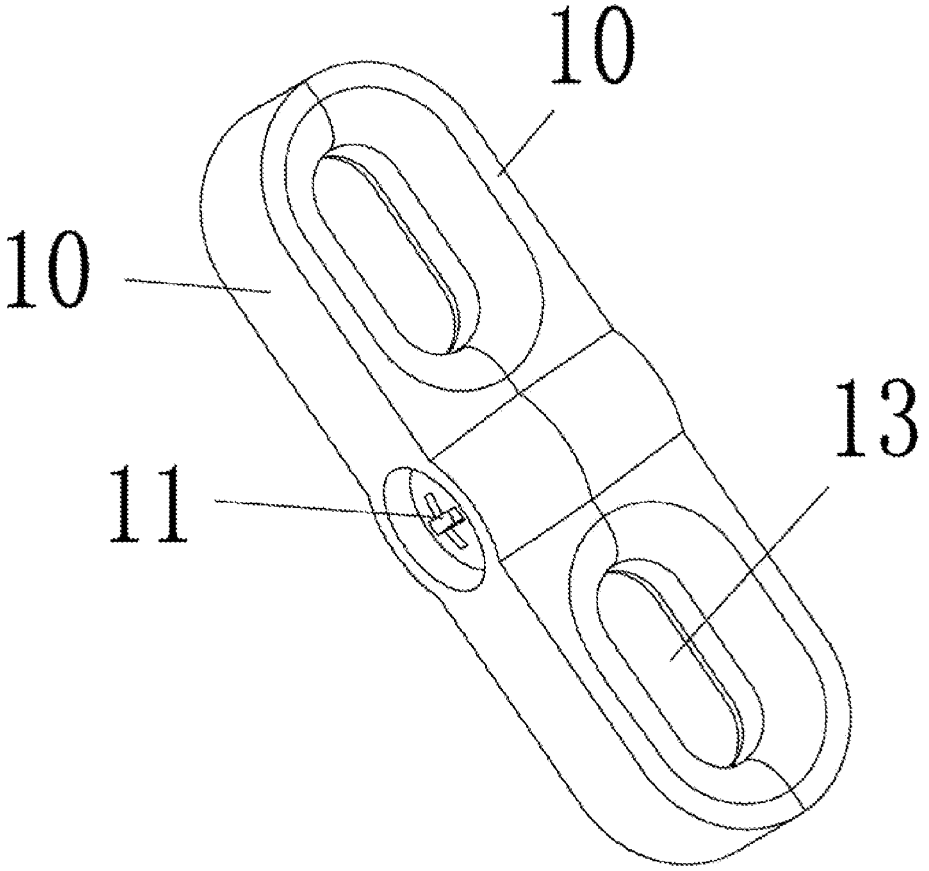
Figure 3C:
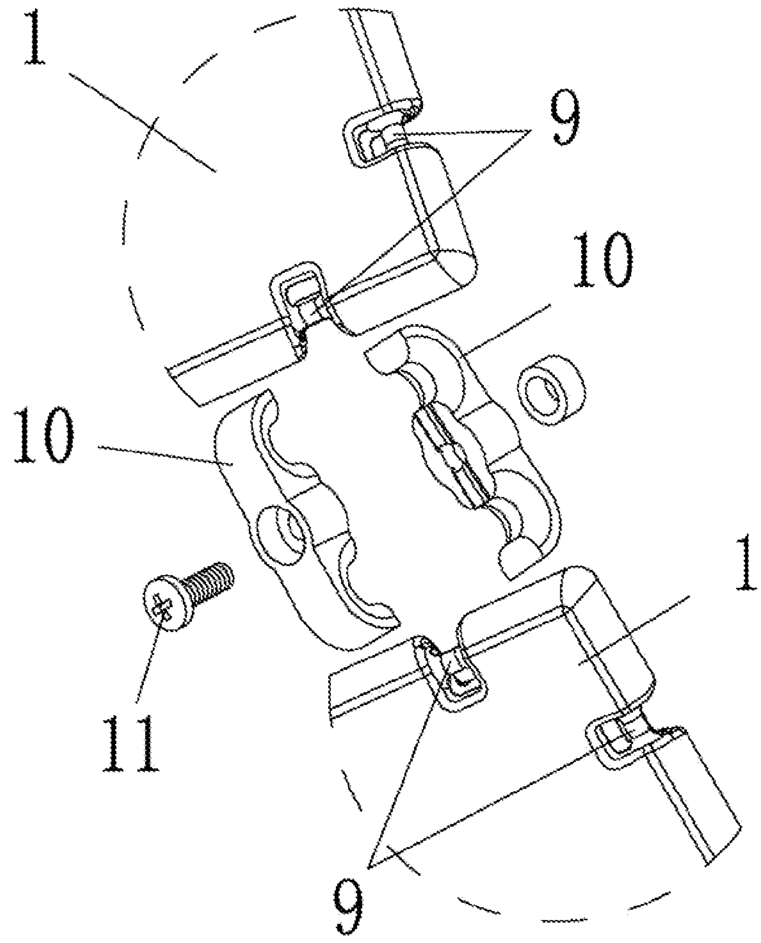
FIG. 3*c* is a schematic exploded diagram of a connection mechanism according to the third embodiment of the present invention.
Figure 3D:
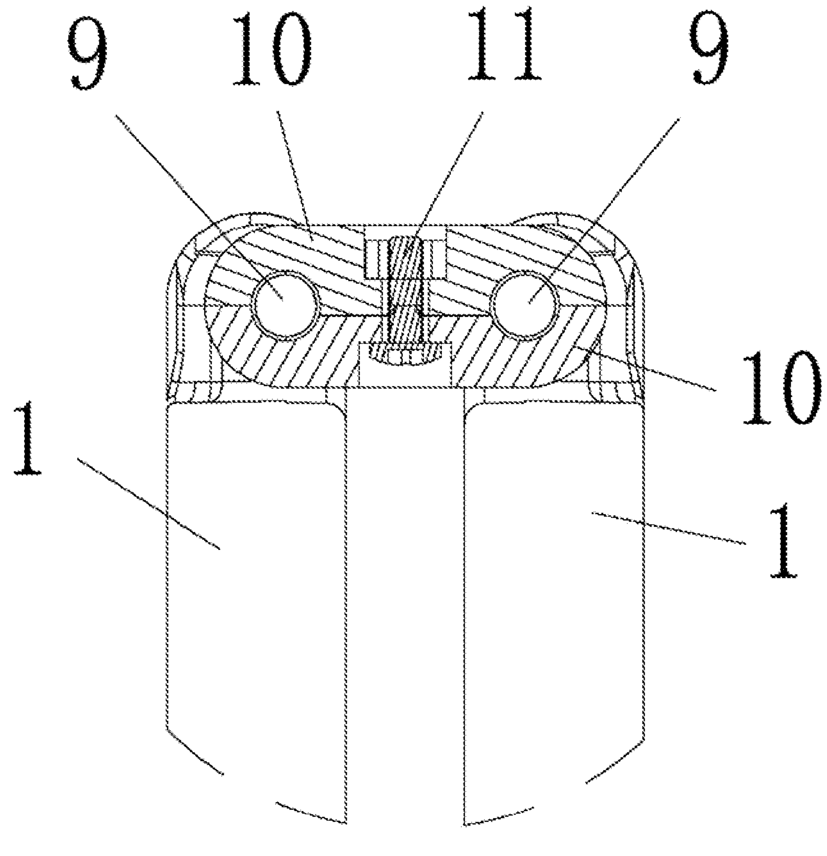
FIG. 3*d* is a schematic structural diagram of superimposing one LED sub-screen on another by folding the LED sub-screen according to the third embodiment of the present invention.

Referring to FIG. 3*a* to FIG. 3*d*, in a third embodiment of the present invention, the connection mechanism includes: spindles 9 disposed at the upper, lower, left and right edges of the casings of the LED sub-screens 1, and a connection rod rotatably connected to the spindles 9 of the casings of two adjacent LED sub-screens 1, where openings connected to the spindles on the connection rod are circular openings 12 (as shown in FIG. 3*a*) or elliptical openings 13 (as shown in FIG. 3*b*). In this embodiment, the connection rod is constituted by two half connection blocks 10 symmetrical to the axial line of the connection rod through a screw 11.

Figure 4A:
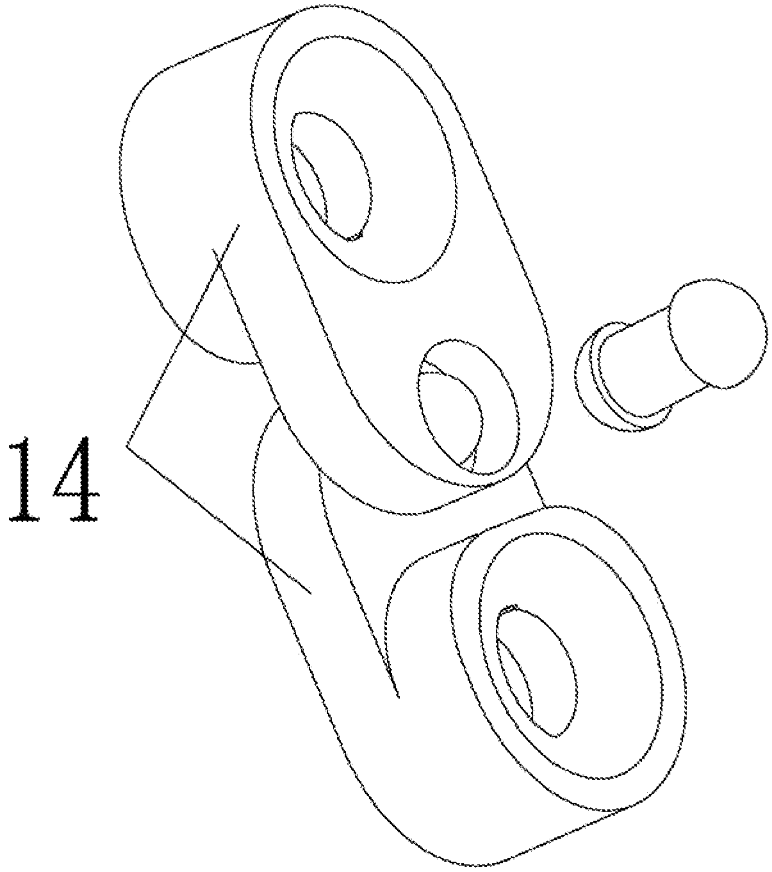
FIG. 4*a* is a three-dimensional view of a connection rod according to a fourth embodiment of the present invention.
Figure 4B:
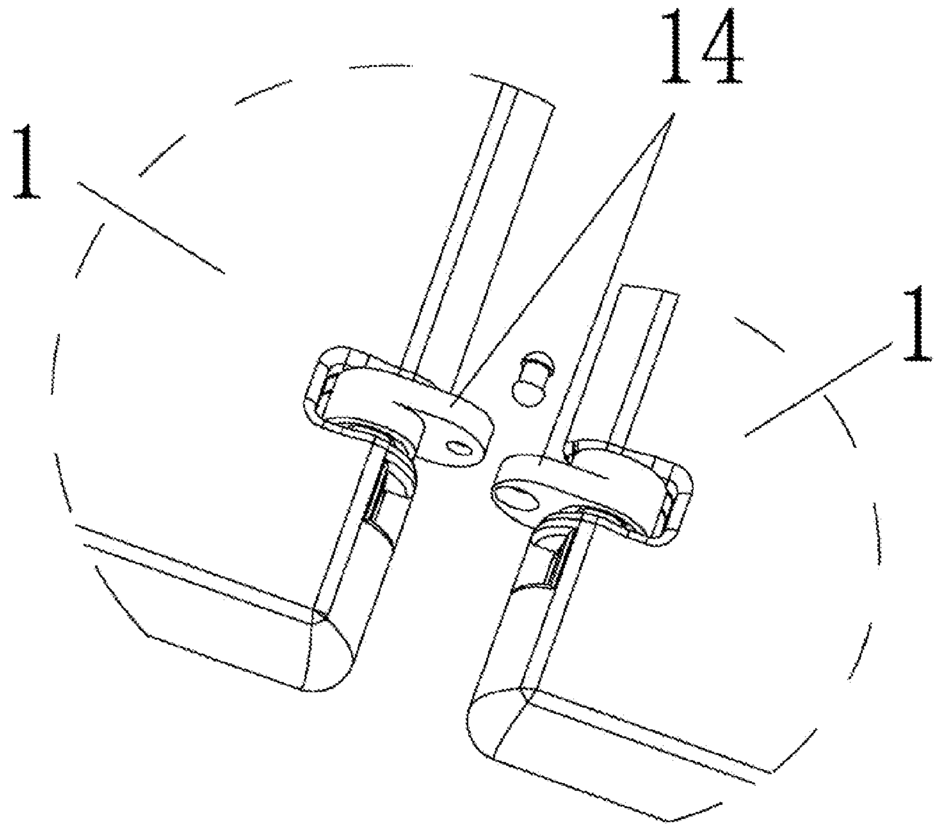
FIG. 4*b* is a schematic exploded diagram of a connection mechanism according to the fourth embodiment of the present invention.
Figure 4C:
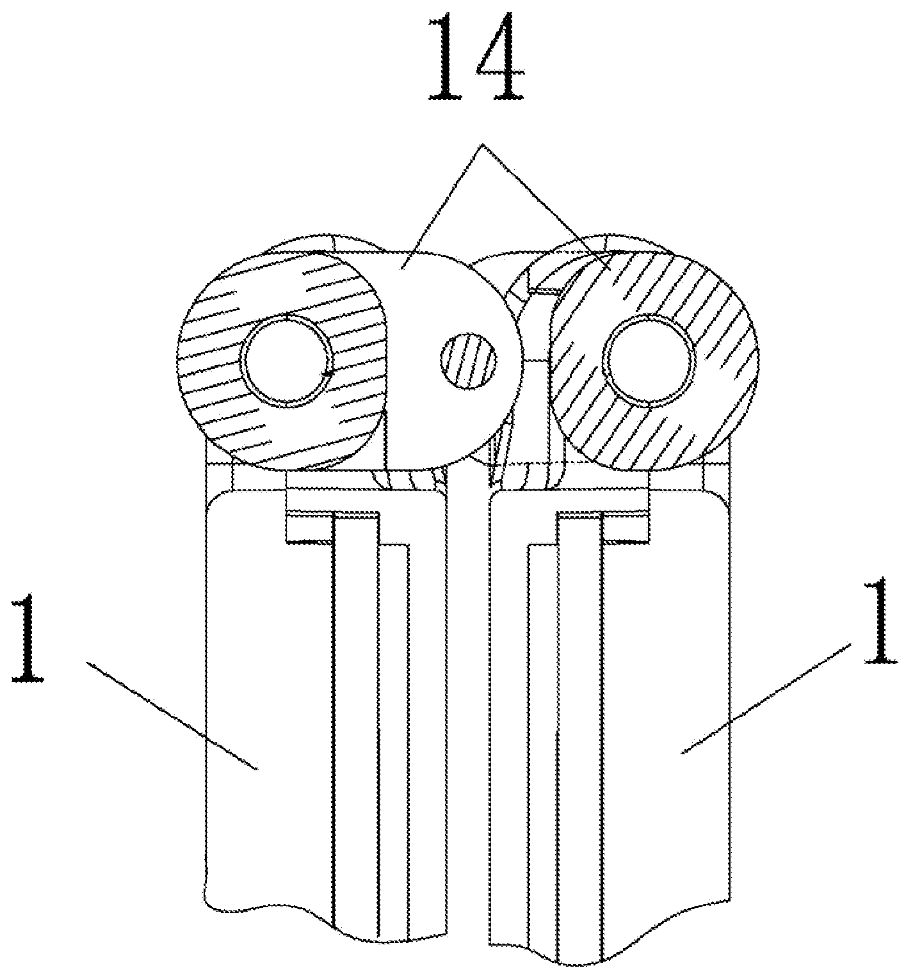
FIG. 4*c* is a schematic structural diagram of superimposing one LED sub-screen on another by folding the LED sub-screen according to the fourth embodiment of the present invention.

Referring to FIG. 4*a* to FIG. 4*c*, in a fourth embodiment of the present invention, the connection mechanism is basically the same as the connection mechanism disclosed in the first embodiment. The difference lies in that the connection rod is a rod-shape member, and is formed by connecting two rod bodies 14 using a hinge. As actually required, the connection rod may also be formed by connecting one or more than two rod bodies using hinges.

Figure 5:
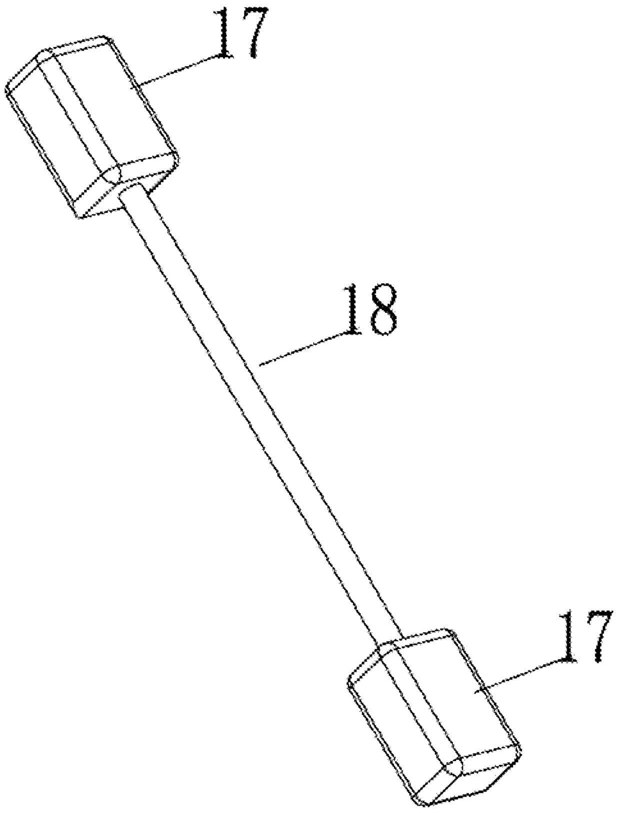
FIG. 5 is a three-dimensional view of a connection mechanism according to a fifth embodiment of the present invention.

Referring to FIG. 5, the connection mechanism may also use a section of flexible rope 18, where the flexible rope are provided with connectors 17 at two ends thereof. The connectors at the two ends are operable to be clipped in clip grooves of the casings of the adjacent LED sub-screens so that the LED sub-screens are connected. In this embodiment, the flexible rope 18 may be steel rope, or nylon rope, or rope made of other flexible materials; and the connectors 17 may be made of materials such as copper or aluminum-zinc alloy. Referring to FIG. 1, steel wire bending grooves 104 concaving inwardly are disposed on the joint between the casings and the steel ropes to provide sufficient space for bending of the steep wires during folding of the screens to achieve flexible folding. Assuredly, when the distance between LED sub-screens is sufficiently wide, the steel wire bending grooves concaving inwardly are not needed. Grooves corresponding to the steel wire bending grooves may also be disposed on the PCBs. The length of conducting wire 22 between adjacent sub-screens 1 is larger than that of the steel rope 18 so that the steel rope 18 sustains the force, thereby preventing the conducting wire 22 from being broken. The steel rope 18 may also be used for electrical connection. That is, the steel rope replaces the conducting wire 22 to serve as a power supply or an electrical signal transmission cable. In this embodiment, the steel ropes in multiple sections are disposed between the sub-screens, the entire screen is spliced by connecting the sub-screens using sections of steel rope, and the weight of the lower parts is sustained by the top steel rope and casings. Consequently, the overall weight sustainability is weak, and such scheme is applicable to small and light screens.

Figure 6:
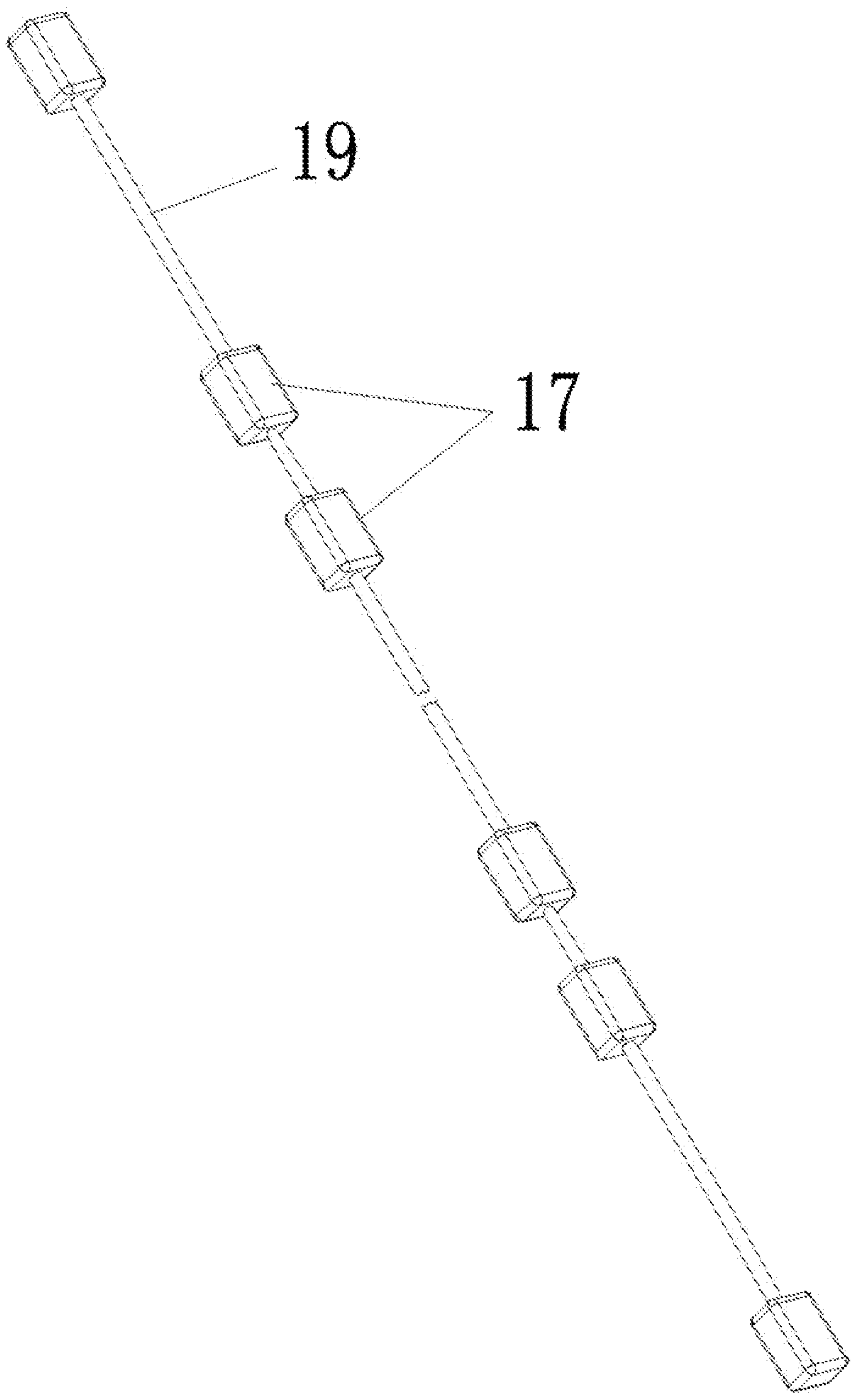
FIG. 6 is a three-dimensional view of a connection mechanism according to a sixth embodiment of the present invention.

Referring to FIG. 6, the connection mechanism may use an entire piece of steel rope 19, and connectors 17 spacedly disposed on the entire piece of flexible rope, where the connectors are respectively clipped in clip grooves of the corresponding casings of the LED sub-screens. In this way, the weight of the screen is sustained by the entire piece of steel rope 19, and the sub-screens only attach on the steel rope 19. Therefore, such connection mechanism is applicable to a larger and heavier screen.

Figure 7A:
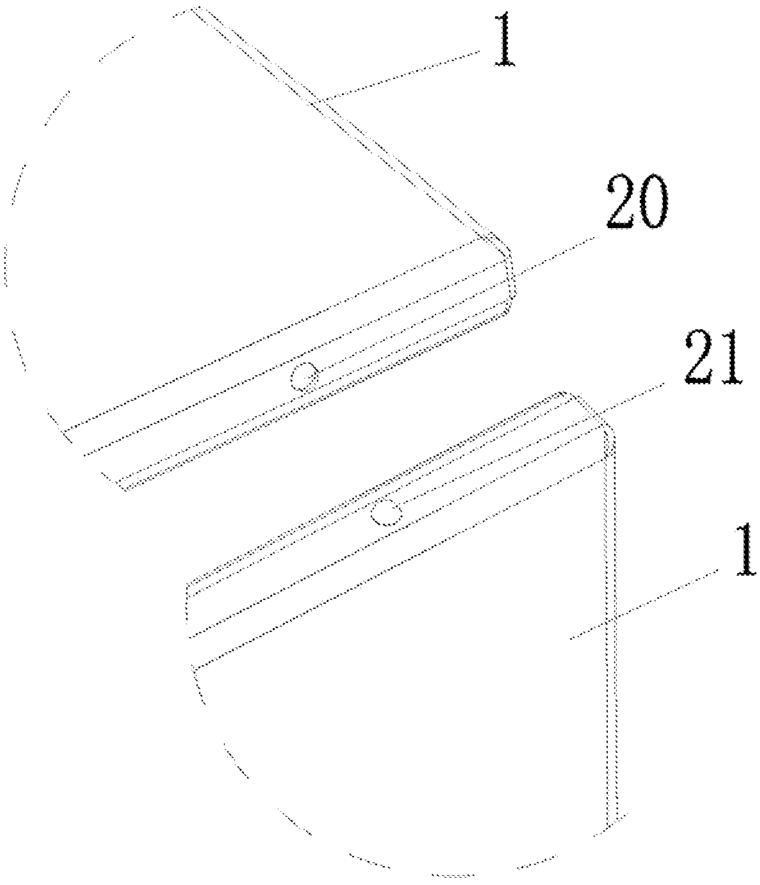
FIG. 7*a* is schematic diagram of a positioning mechanism according to the present invention.
Figure 7B:
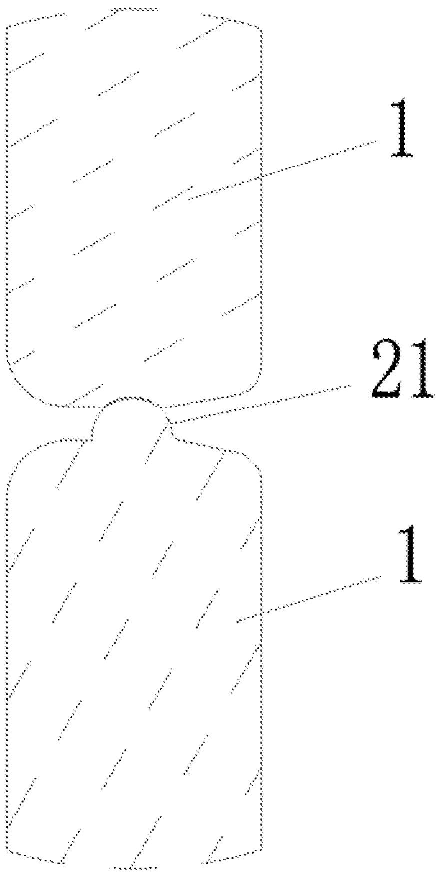
FIG. 7*b* is a schematic connection diagram of engagement of the positioning mechanism according to the present invention.

Referring to FIG. 7*a* and FIG. 7*b*, end faces (lateral and longitudinal end faces) of the casings of the two adjacent LED sub-screens 1 are provided with positioning mechanisms in a concave and convex spherical shape, where the positioning mechanisms are a spherical groove 20 disposed on the end face of one casing and a spherical boss 21 matching the spherical groove 20 and disposed on the end face of the other casing. When the sub-screens are unfolded to a form a plane, the spherical boss 21 engages with the spherical groove 20, fixing the screens to each other from upper, lower, front, and rear directions, and ensuring a consistent gap between the sub-screens in the upper, lower, front, and rear directions. The left-right distance is fixed by the steel rope or the rotation shaft, thereby ensuring uniform distribution of pixels on the entire screen, and enable of the screen to be flat. When the screen is folded or unfolded, the spherical groove and the spherical boss may not interfere with each other and be separated to each other, thereby not affecting folding and unfolding of the screen.

Figure 8A:
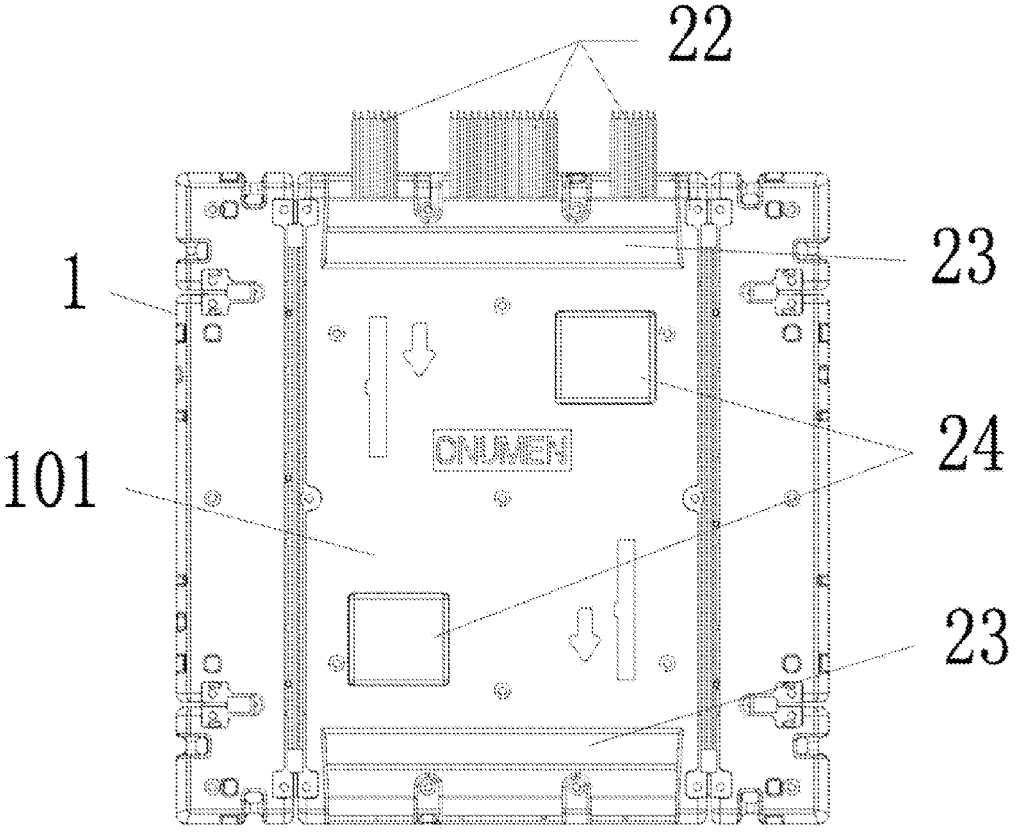
FIG. 8*a* is a rear view of an LED sub-screen according to the present invention.
Figure 8B:
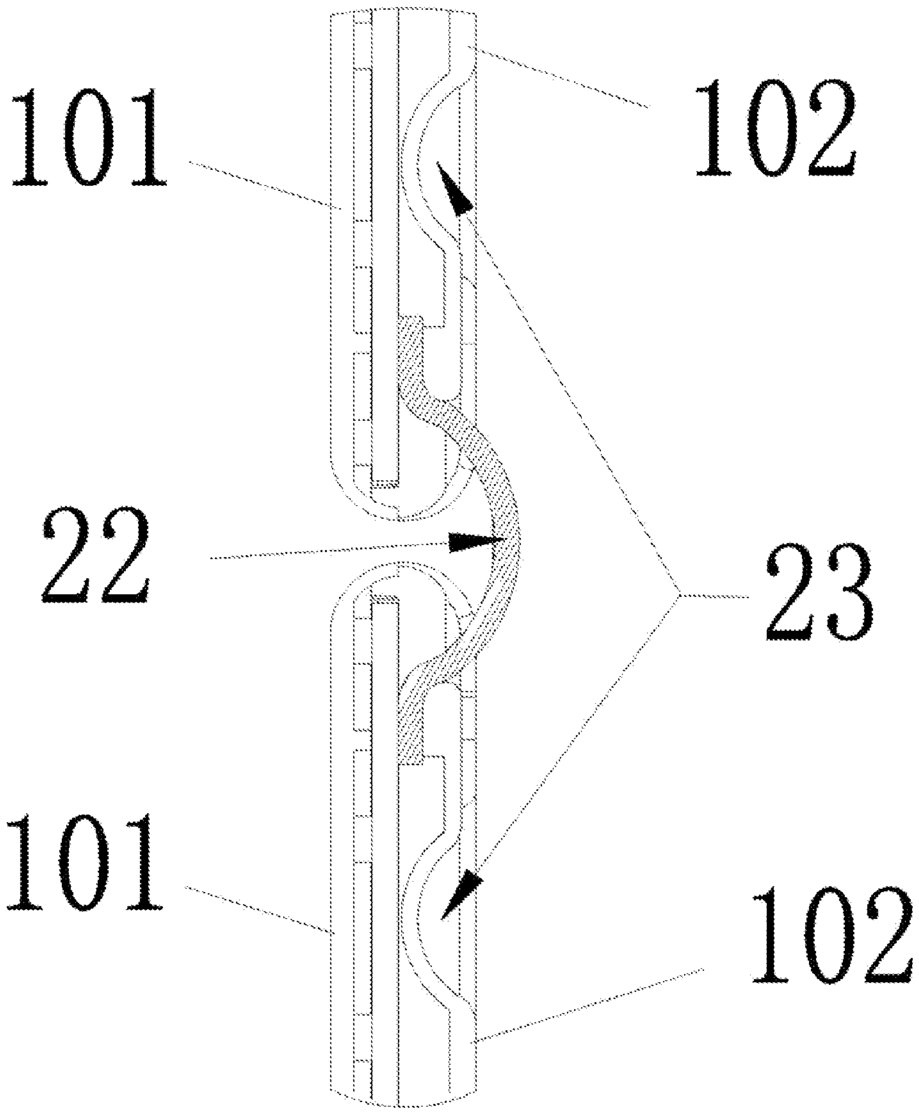
FIG. 8*b* is a schematic connection diagram of conducting wires of two adjacent LED sub-screens according to the present invention.
Figure 8C:
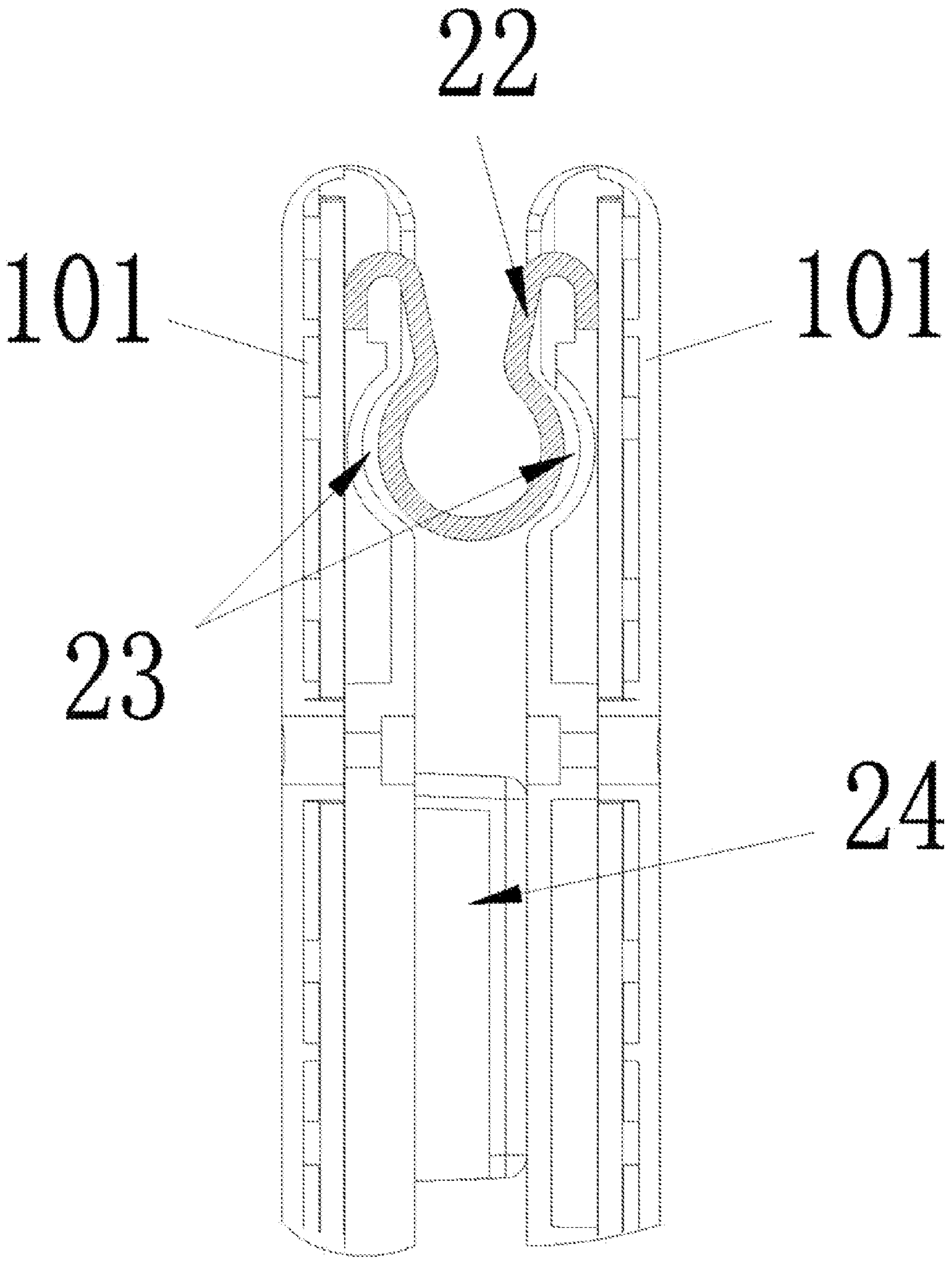
FIG. 8*c* is a schematic structural diagram of superimposing one LED sub-screen on another by folding the LED sub-screen according to the present invention.

As shown in FIGS. 8*a* to 8*c*, the casing of the LED sub-screen 1 includes a front casing 101 and a rear casing 102, where wire ducts 23 are symmetrically disposed on one end of the rear casing 102 and an isolation boss 24 is further disposed on the middle part of the rear casing. After the sub-screens 1 are folded, a gap formed between two sub-screens 1 may be used for housing the conducting wires 22 so that the conducting wires 22 are not pressed and damaged. Meanwhile, arc guides are arranged at the positions where the conducting wires are bent. This ensures that the conducting wires are bent at a reliable arc degree, thereby improves the life cycle of the conducting wires.

With the connection mechanism provided in the present invention, the LED sub-screens 1 are spliced longitudinally and laterally into a large screen. After an LED controller and a power supply are provided, LED video display may be implemented on the large screen. The large screen can be longitudinally or laterally folded. The folded screen has a small size, a smaller weight compared against a traditional casing-type screen, and a smaller transportation and storage cost. In addition, the installation is simple and convenient. Since the LED sub-screens can be freely rotated and folded, different shapes of screens, for example, arc screen, spherical screen, and cylindrical screen are simply implemented, and moreover, usage and installation are simple and convenient. According to the present invention, the LED sub-screens 1 can be used independently without use of casings but requiring PCBs, applicable to a scenario where no protection is required. Alternatively, the PCBs are processed by using the full pouring sealant process or half pouring sealant process, applicable to outdoor or underwater scenario.

The above descriptions are merely preferred embodiments of the present invention, but are not intended to limit the present invention. Any modification, equivalent replacement, or improvement made without departing from the spirit and principle of the present invention should fall within the protection scope of the present invention.

What is claimed is:

1. A freely-foldable flexible LED screen, comprising a plurality of LED sub-screens, PCBs disposed inside casings of the LED sub-screens, LEDs disposed on the PCB, and conducting wires electrically connecting the PCBs; wherein adjacent LED sub-screens are connected by using a connection mechanism capable of relatively freely rotating.

2. The freely-foldable flexible LED screen according to claim 1, wherein: the connection mechanism comprises a rotation rod, and rotation shafts disposed at two ends of the rotation rod; the casing of the LED sub-screen comprises a front casing and a rear casing; wherein grooves are symmetrically disposed at edges of the front casing and the rear casing, the rotation shafts at the two ends of the rotation rod are respectively installed in grooves in the casings of two adjacent LED sub-screens, the grooves of the front casing and the rear casing are further provided with close covers connecting to the rotation shafts, wherein the close cover corresponding to the rotation shaft is provided with a rotation shaft groove that is rotatably connected to the rotation shaft, the rotation shaft being in shape of a cylindrical opening or an elliptical cylinder opening.

3. The freely-foldable flexible LED screen according to claim 2, wherein the rotation rod is formed by connecting at least two rod bodies using a hinge.

4. The freely-foldable flexible LED screen according to claim 1, wherein the connection mechanism comprises spindles disposed at the edges of the casings, and a connection rod rotatably connected to the spindles of the casings of two adjacent LED sub-screens, wherein openings connected to the spindles on the connection rod are circular openings or elliptical openings.

5. The freely-foldable flexible LED screen according to claim 4, wherein the connection rod is formed by connecting at least two rod bodies using a hinge.

6. The freely-foldable flexible LED screen according to claim 4, wherein the connection rod is constituted by two half connection blocks symmetrical to the axial line of the connection rod through a screw.

7. The freely-foldable flexible LED screen according to claim 1, wherein the connection mechanism comprises a section of flexible rope, wherein two ends of the flexible rope are provided with connectors, the two connectors being respectively clipped in clip grooves of the casings of the adjacent LED sub-screens.

8. The freely-foldable flexible LED screen according to claim 1, wherein the connection mechanism comprises an entire piece of flexible rope, and connectors spacedly disposed on the entire piece of flexible rope, wherein the connectors are respectively clipped in clip grooves of the corresponding casings of the LED sub-screens.

9. The freely-foldable flexible LED screen according to claim 1, wherein end faces of the casings of the two adjacent LED sub-screens are provided with positioning mechanisms in a concave and convex spherical shape, wherein the positioning mechanisms are a spherical groove disposed on the end face of one casing and a spherical boss matching the spherical groove and disposed on the end face of the other casing.

10. The freely-foldable flexible LED screen according to claim 1, wherein the casing of the LED sub-screen comprises a front casing and a rear casing, wherein wire ducts are symmetrically disposed on edges of the rear casing and an isolation boss is further disposed on the middle part of the rear casing.

* * * * *